(12) United States Patent
Kim et al.

(10) Patent No.: US 11,498,225 B2
(45) Date of Patent: Nov. 15, 2022

(54) TOUCH INPUT PROCESSING METHOD AND ELECTRONIC DEVICE SUPPORTING THE SAME

(71) Applicant: Samsung Electronics Co., Ltd., Suwon-si (KR)

(72) Inventors: Junghan Kim, Suwon-si (KR); Sungjin Park, Suwon-si (KR); Seunghwan Lee, Suwon-si (KR); Baeseok Lim, Suwon-si (KR); Woojong Cho, Suwon-si (KR); Kuyoung Choi, Suwon-si (KR); Hyoseok Na, Suwon-si (KR); Changryong Heo, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 245 days.

(21) Appl. No.: 16/797,940

(22) Filed: Feb. 21, 2020

(65) Prior Publication Data
US 2020/0269438 A1    Aug. 27, 2020

(30) Foreign Application Priority Data
Feb. 21, 2019    (KR) .................... 10-2019-0020497

(51) Int. Cl.
*B25J 13/08*    (2006.01)
*G06F 3/041*    (2006.01)

(52) U.S. Cl.
CPC ........ *B25J 13/081* (2013.01); *G06F 3/04144* (2019.05); *G06F 2203/04104* (2013.01)

(58) Field of Classification Search
CPC . B25J 13/081; B25J 11/0005; G06F 3/04144; G06F 2203/04104; G06F 3/0416;
(Continued)

(56) References Cited

U.S. PATENT DOCUMENTS 9,524,041 B2    12/2016    Phulwani et al.
9,785,284 B2    10/2017    Sandblad et al.
(Continued)

FOREIGN PATENT DOCUMENTS

JP    2004-333340 A    11/2004
JP    2006-287520 A    10/2006
(Continued)

OTHER PUBLICATIONS

International Search Report dated Jun. 23, 2020 in connection with International Patent Application No. PCT/KR2020/002527, 3 pages.
(Continued)

*Primary Examiner* — Temesghen Ghebretinsae
*Assistant Examiner* — Ivelisse Martinez Quiles

(57) ABSTRACT

An electronic device including: a housing; a sensor module disposed on an inner face of the housing and including a plurality of sensing units; and a processor positioned within the housing and electrically connected to the sensor module. Each of the plurality of sensing units is electrically connected to another sensing unit adjacent thereto among the plurality of sensing units, and includes a central portion and a plurality of peripheral portions connected to a partial area of the central portion and arranged around the central portion, and each of the central portion and the plurality of peripheral portions includes a touch sensor. In addition to this, various embodiments understood through this document are possible.

19 Claims, 15 Drawing Sheets

(58) Field of Classification Search
CPC ........ G06F 3/0414; G06F 3/042; G06F 3/043;
G06F 2203/04102; G06F 3/041–04897;
G06F 3/03547; G06F 2203/04106; G06F
2203/04808; G06F 1/181; G06F 3/04186;
G06F 3/0448; G06F 3/046; G06F
3/04883; G06N 3/008; H03K 2017/9602;
G05B 19/042
See application file for complete search history.

(56) References Cited

U.S. PATENT DOCUMENTS

| | | |
|---|---|---|
| 9,996,207 B2 | 6/2018 | Lee et al. |
| 2004/0119342 A1 | 6/2004 | Sato et al. |
| 2010/0234997 A1 | 9/2010 | Sandini et al. |
| 2013/0194230 A1 | 8/2013 | Kawaguchi et al. |
| 2014/0204059 A1 | 7/2014 | Geaghan |
| 2016/0239144 A1 | 8/2016 | Tang |
| 2016/0328078 A1 | 11/2016 | Lee et al. |
| 2016/0364070 A1* | 12/2016 | Chen ............... G06F 3/0412 |
| 2018/0121078 A1* | 5/2018 | Kim ................ G06F 3/04883 |
| 2018/0311569 A1* | 11/2018 | Bucci ............... G06N 3/063 |
| 2018/0329535 A1 | 11/2018 | Vallett et al. |
| 2020/0050299 A1* | 2/2020 | Lin ................. G06F 3/03547 |

FOREIGN PATENT DOCUMENTS

| | | |
|---|---|---|
| JP | 2018-192559 A | 12/2018 |
| KR | 10-2011-0076426 A | 7/2011 |
| KR | 10-1913817 B1 | 10/2018 |
| WO | 2015/105329 A1 | 7/2015 |

OTHER PUBLICATIONS

Written Opinion of the International Searching Authority dated Jun. 23, 2020 in connection with International Patent Application No. PCT/KR2020/002527, 4 pages.

Supplementary European Search Report dated Jan. 20, 2022, in connection with European Application No. 20758728.8, 8 pages.

* cited by examiner

TOUCH INPUT PROCESSING METHOD AND ELECTRONIC DEVICE SUPPORTING THE SAME

CROSS-REFERENCE TO RELATED APPLICATION

This application is based on and claims priority under 35 U.S.C. 119 based on Korean Patent Application No. 10-2019-0020497, filed on Feb. 21, 2019, in the Korean Intellectual Property Office, the disclosure of which is herein incorporated by reference in its entirety.

BACKGROUND

1. Field

Various embodiments relate to technology for processing a touch input.

2. Description of Related Art

A robot is an electronic device capable of making a determination and moving autonomously, and may play an important role as a tool for performing various tasks on behalf of humans. For example, robots may be used to automate many types of tasks, including, for example, logistics, assembly, welding, and painting in manufacturing production lines, whereby the robots are capable of contributing to improving productivity and protecting humans from working under inhumane conditions, and are capable of performing various tasks on behalf of humans even in an extreme environment. In addition, since robots are capable of behaving similar to humans and interacting with users, robots are able to induce significant interest therein and engage users, especially children. Thus, it is possible to provide education or play more easily using robots.

Such robots may recognize (or sense) a user's touch input (a simple touch or complex touch gesture) as part of a user interface, and may provide various functions in response to the recognized touch input. In order to recognize the user's touch input, a robot may include a touch sensor. For example, at least one touch sensor may be disposed along the inner wall surface of a housing forming the exterior of a robot.

The above information is presented as background information only to assist with an understanding of the disclosure. No determination has been made, and no assertion is made, as to whether any of the above might be applicable as prior art with regard to the disclosure.

SUMMARY

In the conventional touch recognition method using a touch sensor, a touch input is sensed only in an area where a touch sensor is disposed. Therefore, it is necessary to mount touch sensors on the entire surface of the robot in order to recognize touch. Otherwise, it is inevitable to abandon touch recognition in some surface areas. In addition, when a user's touch input is a continuous touch input with a plurality of direction changes, there is a problem in that the touch is not recognized, or is misrecognized as a simple touch. In addition, when the area in which a touch sensor is to be mounted is a curved surface rather than a flat surface, it is difficult to mount the touch sensor, and even when the touch sensor is mounted, it is difficult to realize consistent touch sensitivity throughout the mounted surface area. Thus, there is a problem in that the accuracy of touch recognition is poor.

Various embodiments may provide an electronic device including a touch module capable of sensing a continuous touch input with a plurality of direction changes, and a method of processing a touch input of the electronic device.

In addition, various embodiments may provide an electronic device including a touch module capable of sensing a touch input in an area adjacent to an area in which a touch sensor is mounted, and a method of processing a touch input of the electronic device.

Furthermore, various embodiments may provide an electronic device including a touch module capable of being mounted even in an area including a curved surface, and a method of processing a touch input of the electronic device.

An electronic device may include: a housing; a sensor module disposed on an inner face of the housing and including a plurality of sensing units; and a processor positioned within the housing and electrically connected to the sensor module. Each of the plurality of sensing units may be electrically connected to another sensing unit adjacent thereto among the plurality of sensing units, and may include a central portion and a plurality of peripheral portions connected to a partial area of the central portion and arranged around the central portion, and each of the central portion and the plurality of peripheral portions may include a touch sensor.

A touch input processing method of an electronic device may include: an operation of sensing a touch input through a sensor module disposed on an inner face of a housing of the electronic device and including a plurality of sensing units, each of the plurality of sensing units including a plurality of touch sensors; an operation of confirming mounting positions and a sensing order of touch sensors in which the touch input is sensed, among the plurality of touch sensors, through a processor disposed inside the housing and electrically connected to the sensor module; and an operation of determining a touch trajectory of the touch input based on the mounting positions and the sensing order through the processor. Each of the plurality of sensing units may be electrically connected to another sensing unit adjacent thereto among the plurality of sensing units, and may include a central portion and a plurality of peripheral portions connected to a partial area of the central portion and arranged around the central portion. Each of the central portion and the plurality of peripheral portions may include a touch sensor.

According to various embodiments, more detailed and accurate command transmission may be enabled by detecting a continuous touch input with a plurality of direction changes.

In addition, according to various embodiments, by detecting a touch input even in the surface area in which no touch sensor is mounted, touch sensors may be mounted in a minimum surface area, rather than being mounted over the entire surface area. Therefore, it is possible to reduce material costs and to simplify an assembly process.

In addition, according to various embodiments, a touch sensor is capable of being mounted on a surface area including a curved surface, thereby enabling touch recognition over almost an entire desired surface area.

In addition, various effects may be provided that may be directly or indirectly understood through this document.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely.

Moreover, various functions described below can be implemented or supported by one or more computer programs, each of which is formed from computer readable program code and embodied in a computer readable medium. The terms "application" and "program" refer to one or more computer programs, software components, sets of instructions, procedures, functions, objects, classes, instances, related data, or a portion thereof adapted for implementation in a suitable computer readable program code. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable memory device.

Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

The above and other aspects, features, and advantages of certain embodiments of the disclosure will be more apparent from the following description taken in conjunction with the accompanying drawings, in which.

In connection with the description of the drawings, the same or similar components may be denoted by the same or similar reference numerals.

DETAILED DESCRIPTION

Figure 1:
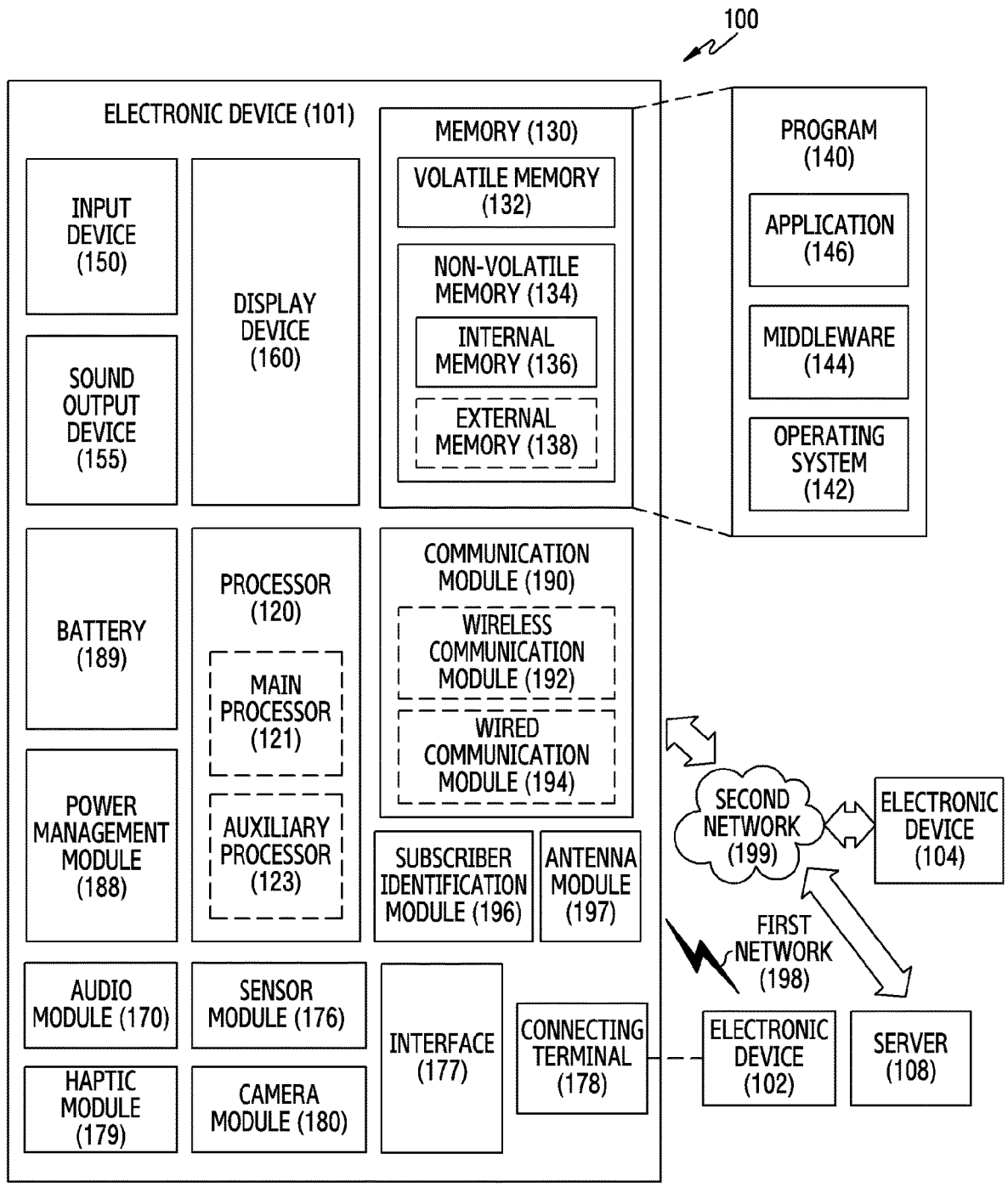
FIG. 1 is a block diagram illustrating an electronic device according to various embodiments in a network environment.

FIGS. 1 through 15, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged system or device.

Hereinafter, various embodiments will be described with reference to the accompanying drawings. For convenience of description, the components illustrated in the drawings may be exaggerated or reduced in size, and the disclosure is not necessarily limited to the illustrated examples.

FIG. 1 is a block diagram illustrating an electronic device 101 in a network environment 100 according to various embodiments. Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, a keyboard, or a digital pen (e.g., a stylus pen).

The sound output device 155 may output sound signals to the outside of the electronic device 101. The sound output device 155 may include, for example, a speaker or a receiver. The speaker may be used for general purposes, such as playing multimedia or playing record, and the receiver may be used for incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., PCB). According to an embodiment, the antenna module 197 may include a plurality of antennas. In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

Figure 2:
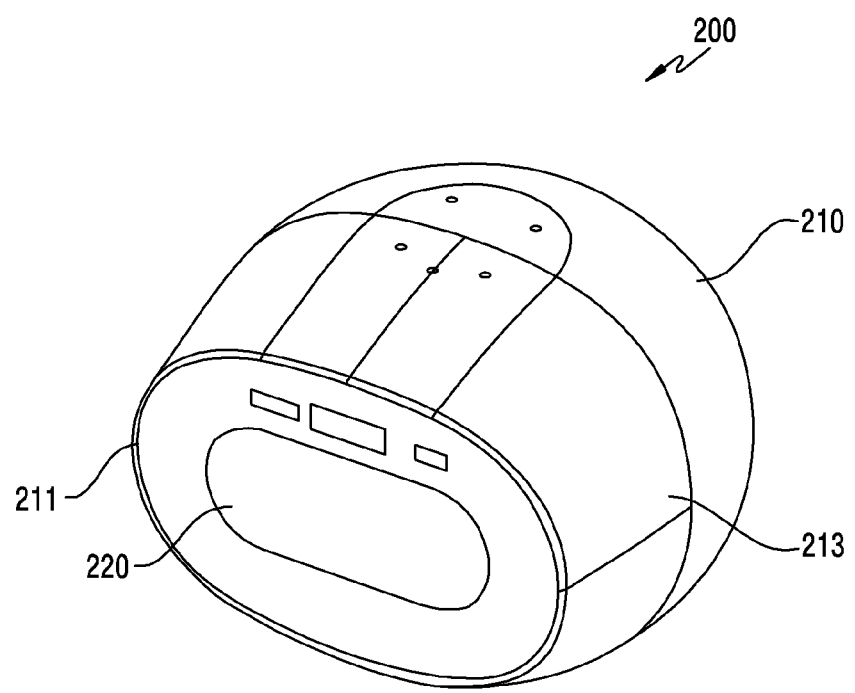
FIG. 2 is a perspective view illustrating an electronic device according to an embodiment.
Figure 3:
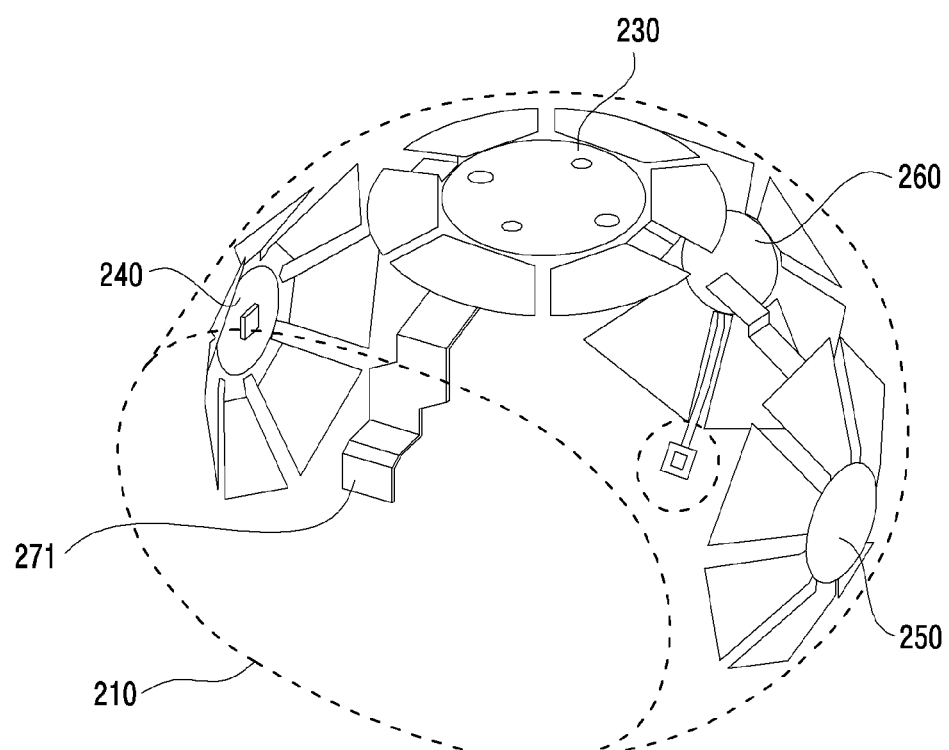
FIG. 3 is a view illustrating a sensor module disposed inside an electronic device according to an embodiment.
Figure 4:
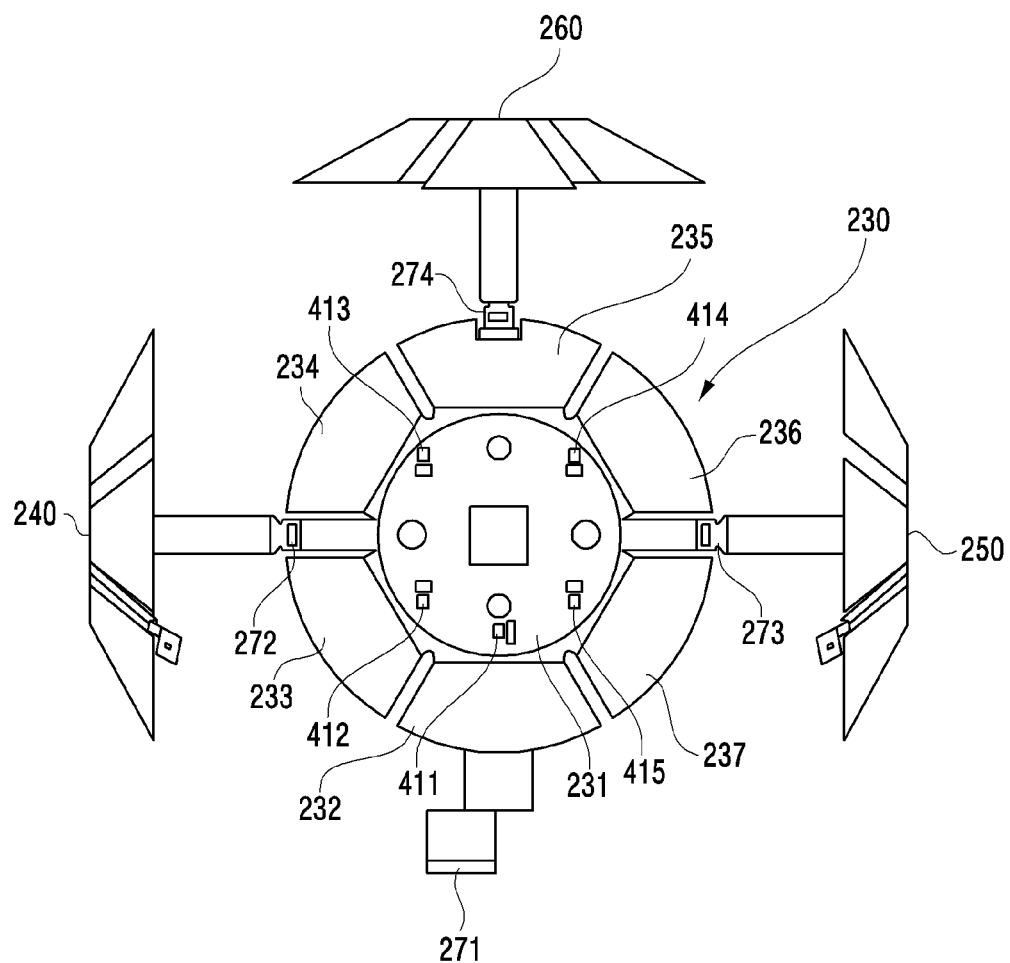
FIG. 4 is a plan view illustrating the sensor module of FIG. 3.
Figure 5:
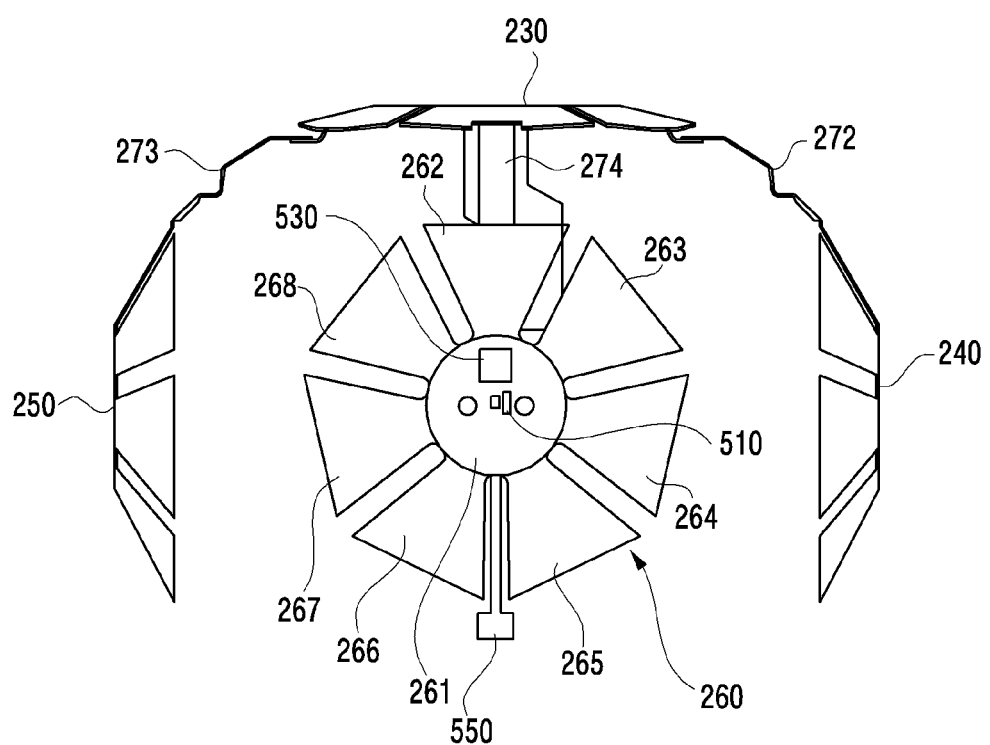
FIG. 5 is a rear view illustrating the sensor module of FIG. 3.
Figure 6:
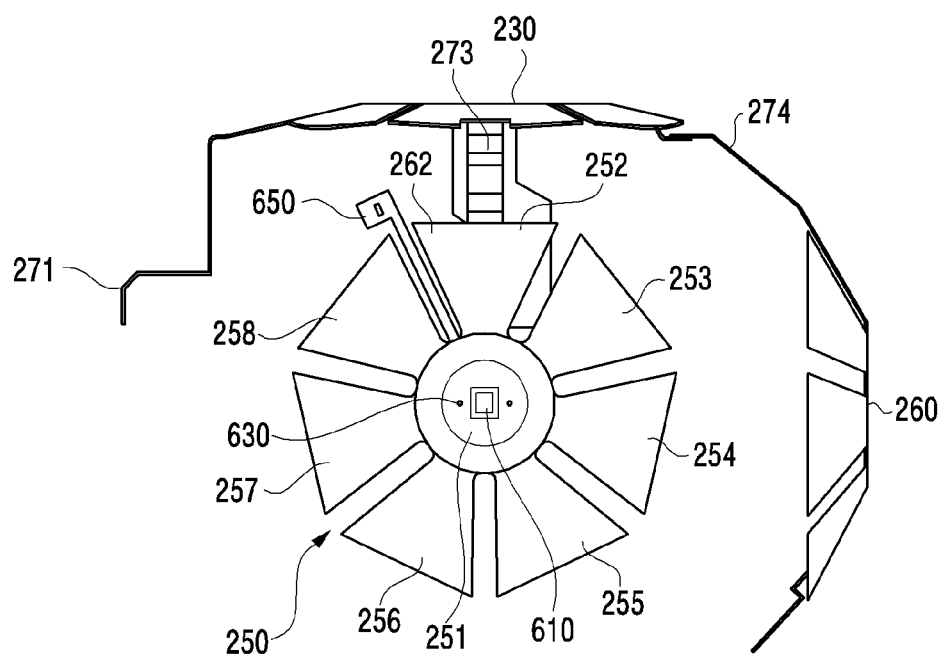
FIG. 6 is a side view illustrating the sensor module of FIG. 3.

FIG. 2 is a perspective view illustrating an electronic device according to an embodiment, FIG. 3 is a view illustrating a sensor module disposed inside an electronic device according to an embodiment, FIG. 4 is a plan view illustrating the sensor module of FIG. 3, FIG. 5 is a rear view illustrating the sensor module of FIG. 3, and FIG. 6 is a side view illustrating the sensor module of FIG. 3.

Referring to FIGS. 2 to 6, an electronic device 200 (e.g., the electronic device 101) may include a housing 210 forming an exterior, a display 220 exposed to the outside through at least one face of the housing 210, sensor modules 230, 240, 250, and 260 disposed on inner faces of the housing 210, and a main board disposed inside the housing 210. However, the configuration of the electronic device 200 is not limited thereto. According to various embodiments, the electronic device 200 may further include one or more other components in addition to the above-mentioned components. For example, the electronic device 200 may further include a communication circuit for communication with an external device.

The housing 210 may include a first face 211 and a second face 213 surrounding the periphery of the first face 211 and extending from the periphery of the first face 211 to a point spaced apart from the first face 211 by a predetermined distance. The second face 213 may include a curved face in at least a partial area thereof. Accordingly, as illustrated in FIG. 2, at least a partial area of the housing 210 may have a shape protruding in a rounded form. However, the shape of the housing 210 is not limited thereto. According to various embodiments, the housing 210 may include a front face, a rear face, and a side face surrounding the front and rear faces. Here, the front face may be the first face 211, and the rear face and the side face may constitute the second face 213.

Since the second face 213 surrounds the periphery of the first face 211, a space may be formed between the first face 211 and the second face 213. In addition, various electronic components for operating the electronic device 200 may be disposed in the space. For example, the display 220, the sensor modules 230, 240, 250, and 260, and the main board may be disposed in the space.

According to an embodiment, at least one face of the housing 210 may include a transparent material. For example, at least a partial area of the first face 211 may be formed of a transparent material (e.g., glass). According to an embodiment, the housing 210 may be formed of various materials such as silicon, rubber, or plastic (e.g., polycarbonate (PC)).

The display 220 (e.g., the display device 160) may be visible to the outside through the first face 211. For example, a screen output through the display 220 may be displayed to the outside through the transparent area of the first face 211.

The sensor modules 230, 240, 250, and 260 (e.g., the sensor module 176) may sense a user input for interacting with a user. For example, the sensor modules 230, 240, 250, and 260 may include a touch sensor that receives a user's touch input. As another example, the sensor modules 230, 240, 250, and 260 may include a microphone that receives a user's voice input. In some embodiments, the sensor modules 230, 240, 250, and 260 may include an optical sensor, an illuminance sensor, a hall sensor, or the like.

The sensor modules 230, 240, 250, and 260 may include a plurality of sensing units. For example, the sensor modules 230, 240, 250, and 260 may include a first sensing unit 230 connected to the main board and at least one other sensing unit (e.g., a second sensing unit 240, a third sensing unit 250, or a fourth sensing unit 260) connected to the first sensing unit 230. FIGS. 3 to 6 illustrates the state in which the sensor modules 230, 240, 250, and 260 include a first sensing unit 230 connected to the main board, a second sensing unit 240 connected to the left side of the first sensing unit 230, a third sensing unit 250 connected to the right side of the first sensing unit 230, and a fourth sensing unit 260 connected to the upper side of the first sensing unit 230. However, the number and manner of connection of sensing units included in the sensor modules 230, 240, 250, and 260 are not limited thereto. FIGS. 3 to 6 illustrated that when it is assumed that the electronic device 200 is configured in a robot head shape, the first sensing unit 230, the second sensing unit 240, the third sensing unit 250, and the fourth sensing unit 260 are respectively disposed in the upper portion, the left portion, the right portion, and the rear portion of the robot head.

Each of the plurality of sensing units may be disposed on (or attached to) the inner face of the housing, which is configured such that the distance from the inner face of the housing 210 is maintained to be substantially constant within a predetermined range of error in order to easily recognize a user's touch. To this end, each of the sensing units may have a structure having a central portion and angular peripheral portions arranged around the central portion. Each of the center portion and peripheral portions may include a touch sensor. According to an embodiment, at least one of the central portion and peripheral portions may include a flexible printed circuit board, which forms a seating face of the touch sensor and is bent along the shape of the inner face of the housing 210 on which the seating face is to be disposed (or attached). Accordingly, the sensing units may be disposed on the inner face of the housing 210 along the inner face of the housing 210.

The sensing units may have various shapes. For example, like the first sensing unit 230 illustrated in FIG. 4, the central portion may have a polygonal shape (e.g., a hexagonal shape), and each of the peripheral portions, connected to a partial area of the central portion and arranged around the central portion, may have a polygonal shape (e.g., a hexagonal shape). In this case, each of the peripheral portions may share one side of the central portion. As another example, like the fourth sensing unit 260 illustrated in FIG. 5 or the third sensing unit 250 illustrated in FIG. 6, the central portion may have a circular shape, and each of the peripheral portions, connected to a partial area of the central portion and arranged around the central portion, may have a polygonal shape (e.g., a trapezoidal shape).

Hereinafter, each sensing unit will be described in detail.

As illustrated in FIG. 4, the first sensing unit 230 may include a central portion 231, as well as a first peripheral portion 232, a second peripheral portion 233, a third peripheral portion 234, a fourth peripheral portion 235, a fifth peripheral portion 236, and a sixth peripheral portion 237, which are connected to a partial area of the central portion 231 and arranged around the central portion 231. FIG. 4 illustrates the state in which the first peripheral portion 232, the second peripheral portion 233, the third peripheral portion 234, the fourth peripheral portion 235, the fifth peripheral portion 236, and the sixth peripheral portion 237 are sequentially arranged around the central portion 231 in a clockwise direction, starting below the central portion 231. However, the number of peripheral portions arranged around the central portion 231 is not limited thereto.

Each of the first peripheral portion 232, the second peripheral portion 233, the third peripheral portion 234, the fourth peripheral portion 235, the fifth peripheral portion 236, and the sixth peripheral portion 237 may be electrically connected to the central portion 231, and each of the central portion 231, the first peripheral portion 232, the second peripheral portion 233, the third peripheral portion 234, the fourth peripheral portion 235, the fifth peripheral portion 236, and the sixth peripheral portion 237 may include a touch sensor. According to an embodiment, each of the central portion 231, the first peripheral portion 232, the second peripheral portion 233, the third peripheral portion 234, the fourth peripheral portion 235, the fifth peripheral portion 236, and the sixth peripheral portion 237 may form one touch channel that senses a touch input.

According to an embodiment, one of the peripheral portions may be electrically connected to the main board. For example, as illustrated in FIG. 4, the first peripheral portion 232 may be electrically connected to the main board via a first connector 271. In some embodiments, the main board may be directly electrically connected to the central portion 231 via the first connector 271.

According to an embodiment, the first sensing unit 230 may be electrically connected to another sensing unit through at least one connector. For example, as illustrated in FIG. 4, the first sensing unit 230 may be electrically connected to the second sensing unit 240 via a second connector 272, may be electrically connected to the third sensing unit 250 via a third connector 273, and may be electrically connected to the fourth sensing unit 260 via a fourth connector 274. Each of the second connector 272, the third connector 273, and the fourth connector 274 may be connected to a central portion or a peripheral portion other than the central portion 231 or a peripheral portion of the first sensing unit 230 (e.g., the first peripheral portion 232, the second peripheral portion 233, the third peripheral portion 234, the fourth peripheral portion 235, the fifth peripheral portion 236, or the sixth peripheral portion 237).

The first sensing unit 230 may include a plurality of microphones 411, 412, 413, 414, and 415. For example, the central portion 231 may include a plurality of microphones 411, 412, 413, 414, and 415 disposed on the periphery thereof so as to be spaced apart from each other by a predetermined distance. The microphones 411, 412, 413, 414, and 415 may sense a sound input. The electronic device 200 may obtain a user's voice input through the microphones 411, 412, 413, 414, and 415. In addition, the electronic device 200 may receive sound according to the user's touch input through the microphones 411, 412, 413, 414, and 415. According to an embodiment, the electronic device 200 may analyze the sound input received through the microphones 411, 412, 413, 414, and 415, and may determine the direction of a touch input. For example, when sound according to the user's touch input is received through the microphones 411, 412, 413, 414, and 415, the electronic device 200 may detect a DoA (Direction of Arrival) so as to determine the direction of the touch input. In this case, the electronic device 200 may adjust the sensitivity of the touch sensor based on the direction of the touch input. For example, the electronic device 200 may increase the sensitivity of the touch sensor included in the sensing unit in which the touch input is expected or in a portion (at least one of the central portion or the peripheral portions) of the sensing unit based on the direction of the touch input, thereby improving a touch recognition rate.

As illustrated in FIG. 5, the fourth sensing unit 260 may include a central portion 261, as well as a first peripheral portion 262, a second peripheral portion 263, a third peripheral portion 264, a fourth peripheral portion 265, a fifth peripheral portion 266, a sixth peripheral portion 267, and a seventh peripheral portion 268, which are connected to a partial area of the central portion 261 and arranged around the central portion 261. FIG. 5 illustrates the state in which the first peripheral portion 262, the second peripheral portion 263, the third peripheral portion 264, the fourth peripheral portion 265, the fifth peripheral portion 266, the sixth peripheral portion 267, and the seventh peripheral portion 268 are sequentially arranged around the central portion 261 in a clockwise direction, starting above the central portion 261. However, the number of peripheral portions arranged around the central portion 261 is not limited thereto.

Each of the first peripheral portion 262, the second peripheral portion 263, the third peripheral portion 264, the fourth peripheral portion 265, the fifth peripheral portion 266, the sixth peripheral portion 267, and the seventh peripheral portion 268 may be electrically connected to the central portion 261, and each of the central portion 261, the first peripheral portion 262, the second peripheral portion 263, the third peripheral portion 264, the fourth peripheral portion 265, the fifth peripheral portion 266, the sixth peripheral portion 267, and the seventh peripheral portion 268 may include a touch sensor. According to an embodiment, each of the central portion 261, the first peripheral portion 262, the second peripheral portion 263, the third peripheral portion 264, the fourth peripheral portion 265, the fifth peripheral portion 266, the sixth peripheral portion 267, and the seventh peripheral portion 268 may form one touch channel that senses a touch input.

The fourth sensing unit 260 may include at least one microphone 510. The microphone 510 may detect a sound input. The electronic device 200 may obtain a user's voice input through the microphone 510. In addition, the electronic device 200 may determine the direction of the user's touch input using the microphones 411, 412, 413, 414, and 415 included in the first sensing unit 230 together with the microphone 510 included in the fourth sensing unit 260, and may adjust the sensitivity of the touch sensor based on the determined direction.

The fourth sensing unit 260 may include at least one illuminance sensor 530. The electronic device 200 may obtain an illuminance value through the illuminance sensor 530, may calculate an amount of change in the illuminance value using a plurality of illuminance values obtained at different times, and may determine the direction of the user's touch input based on the amount of change in the illuminance value. For example, when the user moves a hand closer to the fourth sensing unit 260 in order to make a touch, the illuminance value obtained through the illuminance sensor 530 is changed, and, based thereon, the direction in which the user intends to make a touch may be determined. In addition, the electronic device 200 may adjust the sensitivity of the touch sensor based on the direction of the touch input. For example, the electronic device 200 may increase the sensitivity of the touch sensor included in the sensing unit in which the user intends to make a touch or in a portion (at least one of the central portion or the peripheral portions) of the sensing unit, thereby improving a touch recognition rate.

According to an embodiment, the fourth sensing unit 260 may include a power switch 550 of the electronic device 200. When the power switch 550 is in the ON state, power may be supplied to the electronic device 200, and when the power switch 500 is in the OFF state, the power supplied to the electronic device 200 may be cut off.

According to an embodiment, when it is determined that the user's hand approaches the power switch 550 through a microphone (e.g., the microphone 510 or at least one of the microphones 411, 412, 413, 414, and 415) or an illuminance sensor 530, the electronic device 200 may move so as to allow the user to more easily operate the power switch 550.

As illustrated in FIG. 6, the third sensing unit 250 (or the second sensing unit 240) may include a central portion 251, as well as a first peripheral portion 252, a second peripheral portion 253, a third peripheral portion 254, a fourth peripheral portion 255, a fifth peripheral portion 256, a sixth peripheral portion 257, and a seventh peripheral portion 258, which are connected to a partial area of the central portion 251 and arranged around the central portion 251. FIG. 6 illustrates the state in which the first peripheral portion 252, the second peripheral portion 253, the third peripheral portion 254, the fourth peripheral portion 255, the fifth peripheral portion 256, the sixth peripheral portion 257, and the seventh peripheral portion 258 are sequentially arranged around the central portion 251 in a clockwise direction, starting above the central portion 251. However, the number of peripheral portions arranged around the central portion 251 is not limited thereto.

Each of the first peripheral portion 252, the second peripheral portion 253, the third peripheral portion 254, the fourth peripheral portion 255, the fifth peripheral portion 256, the sixth peripheral portion 257, and the seventh peripheral portion 258 may be electrically connected to the central portion 251, and each of the central portion 251, the first peripheral portion 252, the second peripheral portion 253, the third peripheral portion 254, the fourth peripheral portion 255, the fifth peripheral portion 256, the sixth peripheral portion 257, and the seventh peripheral portion 258 may include a touch sensor. According to an embodiment, each of the central portion 251, the first peripheral portion 252, the second peripheral portion 253, the third peripheral portion 254, the fourth peripheral portion 255, the fifth peripheral portion 256, the sixth peripheral portion 257, and the seventh peripheral portion 258 may form one touch channel that senses a touch input.

The third sensing unit 250 (or the second sensing unit 240) may include at least one microphone 610. The microphone 610 may detect a sound input. The electronic device 200 may obtain a user's voice input through the microphone 610. In addition, the electronic device 200 may determine the direction of the user's touch input using the microphones 411, 412, 413, 414, and 415 included in the first sensing unit 230 together with the microphone 610 included in the third sensing unit 250 (or the second sensing unit 240), and may adjust the sensitivity of the touch sensor based on the determined direction.

The third sensing unit 250 (or the second sensing unit 240) may include at least one illuminance sensor 630. The electronic device 200 may obtain an illuminance value through the illuminance sensor 630, may calculate an amount of change in the illuminance value using a plurality of illuminance values obtained at different times, and may determine the direction of the user's touch input based on the amount of change in the illuminance value. For example, when the user moves a hand closer to the third sensing unit 250 (or the second sensing unit 240) in order to make a touch, the illuminance value obtained through the illuminance sensor 630 is changed, and, based thereon, the direction in which the user intends to make a touch may be determined. In addition, the electronic device 200 may adjust the sensitivity of the touch sensor based on the direction of the touch input. For example, the electronic device 200 may increase the sensitivity of the touch sensor included in the sensing unit in which the user intends to make a touch or in a portion (at least one of the central portion or the peripheral portions) of the sensing unit, thereby improving a touch recognition rate.

According to an embodiment, the third sensing unit 250 (or the second sensing unit 240) may include a hall sensor 650. The hall sensor 650 may sense magnetism. The electronic device 200 may determine the approach of an external magnetic body through the hall sensor 650. For example, the electronic device 200 may determine whether a magnetic accessory is attached to an area of the housing 210 in which the third sensing unit 250 (or the second sensing unit 240) is disposed, through the hall sensor 650. When such an accessory is attached, the electronic device 200 may adjust the intensity of a motion such that the accessory is not removed from the housing 210.

The main board may include various electronic components for operating the electronic device 200. For example, a processor (e.g., the processor 120), memory (e.g., the memory 130), a communication circuit (e.g., the communication module 190), an input/output circuit (e.g., the input device 150), a sound output device 155, an audio module 170, or an interface 177 may be mounted on the main board.

The above-described electronic device 200 may be an intelligent robot that is capable of making determinations and moving autonomously and that provides services while intelligently communicating with a user through various means. However, the type of the electronic device 200 is not limited thereto. The electronic device 200 may be any type of device having a surface on which the sensor modules 230, 240, 250, and 260 are capable of being disposed.

Figure 7:
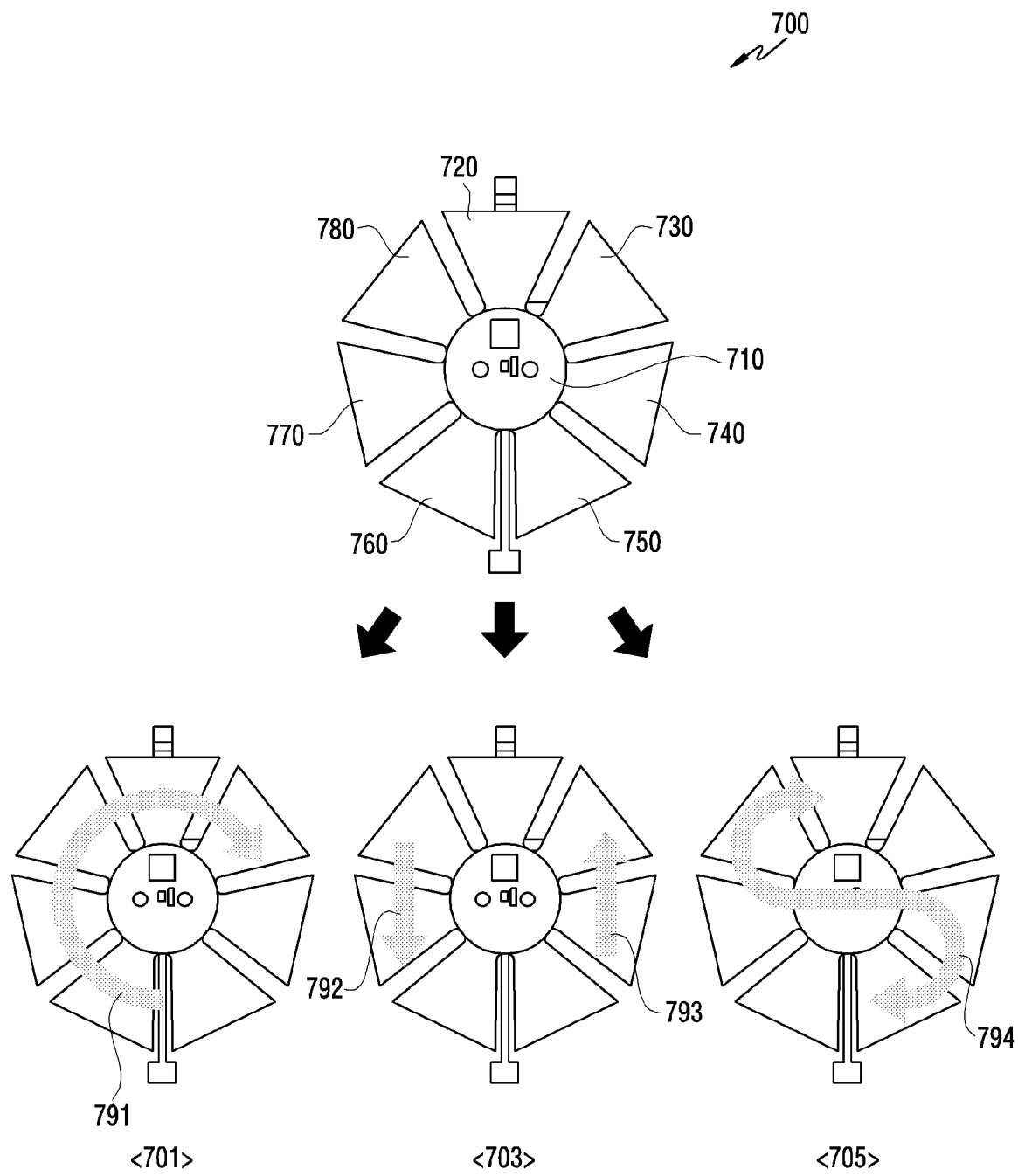
FIG. 7 illustrates a view for describing touch input sensing in a single sensing unit included in a sensor module according to an embodiment.

FIG. 7 illustrates a view for describing touch input sensing in a single sensing unit included in a sensor module according to an embodiment.

Referring to FIG. 7, a sensing unit 700 (e.g., the first sensing unit 230, the second sensing unit 240, the third sensing unit 250, or the fourth sensing unit 260) included in the electronic device 200 may include a central portion 710 and a plurality of peripheral portions connected to a partial area of the central portion 710 and arranged around the central portion 710. For example, as illustrated in FIG. 7, the peripheral portions may include a first peripheral portion 720, a second peripheral portion 730, a third peripheral portion 740, a fourth peripheral portion 750, a fifth peripheral portion 760, a sixth peripheral portion 770, and a seventh peripheral portion 780. The central portion 710 and the peripheral portions may be electrically connected to each other.

Each of the central portion and the peripheral portions may include a touch sensor. For example, each of the central portion 710, the first peripheral portion 720, the second peripheral portion 730, the third peripheral portion 740, the fourth peripheral portion 750, the fifth peripheral portion 760, the sixth peripheral portion 770, and the seventh peripheral portion 780 may form one touch channel that senses a touch input.

The central portion 710, the first peripheral portion 720, the second peripheral portion 730, the third peripheral portion 740, the fourth peripheral portion 750, the fifth peripheral portion 760, the sixth peripheral portion 770, and the seventh peripheral portion 780 may transmit the sensed touch input to the processor, and the processor may determine a touch trajectory by identifying a touch-sensing order and the mounting positions of the central portion 710, the first peripheral portion 720, the second peripheral portion 730, the third peripheral portion 740, the fourth peripheral portion 750, the fifth peripheral portion 760, the sixth peripheral portion 770, and the seventh peripheral portion 780. According to an embodiment, the processor may set a plurality of vectors based on the touch order of the touch channels and the positions of the touch panels (e.g., the central portion 710, the first peripheral portion 720, the second peripheral portion 730, the third peripheral portion 740, the fourth peripheral portion 750, the fifth peripheral portion 760, the sixth peripheral portion 770, or the seventh peripheral portion 780), and may determine a touch trajectory in the manner of connecting the vectors. For example, when a touch input is continuously made through a plurality of touch channels, the processor may set a first vector, of which the start point is the position of a first touch channel where the touch is sensed at the first order among the touch channels and the end point is the position of a second touch channel where the touch is sensed at the second order among the touch channels, may set a second vector, of which the start point is the position of the second touch channel and the end point is the position of a third touch channel where the touch is sensed at the third order among the touch channels, and may determine a touch trajectory by connecting the first vector and the second vector.

As in the first state <701>, when the touch channels from the first order to the fifth order at which a touch input is sensed correspond, in order, to the fifth peripheral portion 760, the sixth peripheral portion 770, the seventh peripheral portion 780, the first peripheral portion 720, and the second peripheral portion 730, the touch input may be recognized as a touch 791 rotating in a clockwise direction when a first vector, of which the start point is the position of the fifth peripheral portion 760 and the end point is the position of the sixth peripheral portion 770, a second vector, of which the start point is the position of the sixth peripheral portion 770 and the end point is the position of the seventh peripheral portion 780, a third vector, of which the start point is the position of the seventh peripheral portion 780 and the end point is the position of the first peripheral portion 720, and a fourth vector, of which the start point is the position of the first peripheral portion 720 and the end point is the position of the second peripheral portion 730, are connected in that order.

As in the second state <703>, when the touch channels from the first order to the third order, at which a touch input is sensed, correspond, in order, to the seventh peripheral portion 780, the sixth peripheral portion 770, and the fifth peripheral portion 760, the touch input may be recognized as a touch 792 moving straight to the bottom end when a first vector, of which the start point is the position of the seventh peripheral portion 780 and the end point is the position of the sixth peripheral portion 770, and a second vector, of which the start point is the position of the sixth peripheral portion 770 and the end point is the position of the fifth peripheral portion 760, are connected. In addition, when the touch channels from the first order to the third order at which a touch input is sensed correspond, in order, to the fourth peripheral portion 750, the third peripheral portion 740, and the second peripheral portion 730, the touch input may be recognized as a touch 793 moving straight to the top end when a first vector, of which the start point is the position of the fourth peripheral portion 750 and the end point is the position of the third peripheral portion 740, and a second vector, of which the start point is the position of the third peripheral portion 740 and the end point is the position of the second peripheral portion 730, are connected.

As in the third state <705>, when the touch channels from the first order to the fifth order at which a touch input is sensed correspond, in order, to the seventh peripheral portion 780, the sixth peripheral portion 770, the central portion 710, the third peripheral portion 740, and the fourth peripheral portion 750, the touch input may be recognized as a continuous touch 794 with a plurality of direction changes when a first vector, of which the start point is the position of the seventh peripheral portion 780 and the end point is the position of the sixth peripheral portion 770, a second vector, of which the start point is the position of the sixth peripheral portion 770 and the end point is the central portion 710, a third vector, of which the start point is the position of the central portion 710 and the end point is the position of the third peripheral portion 740, and a fourth vector, of which the start point is the position of the third peripheral portion 740 and the end point is the position of the fourth peripheral portion 750, are connected in that order.

Figure 8:
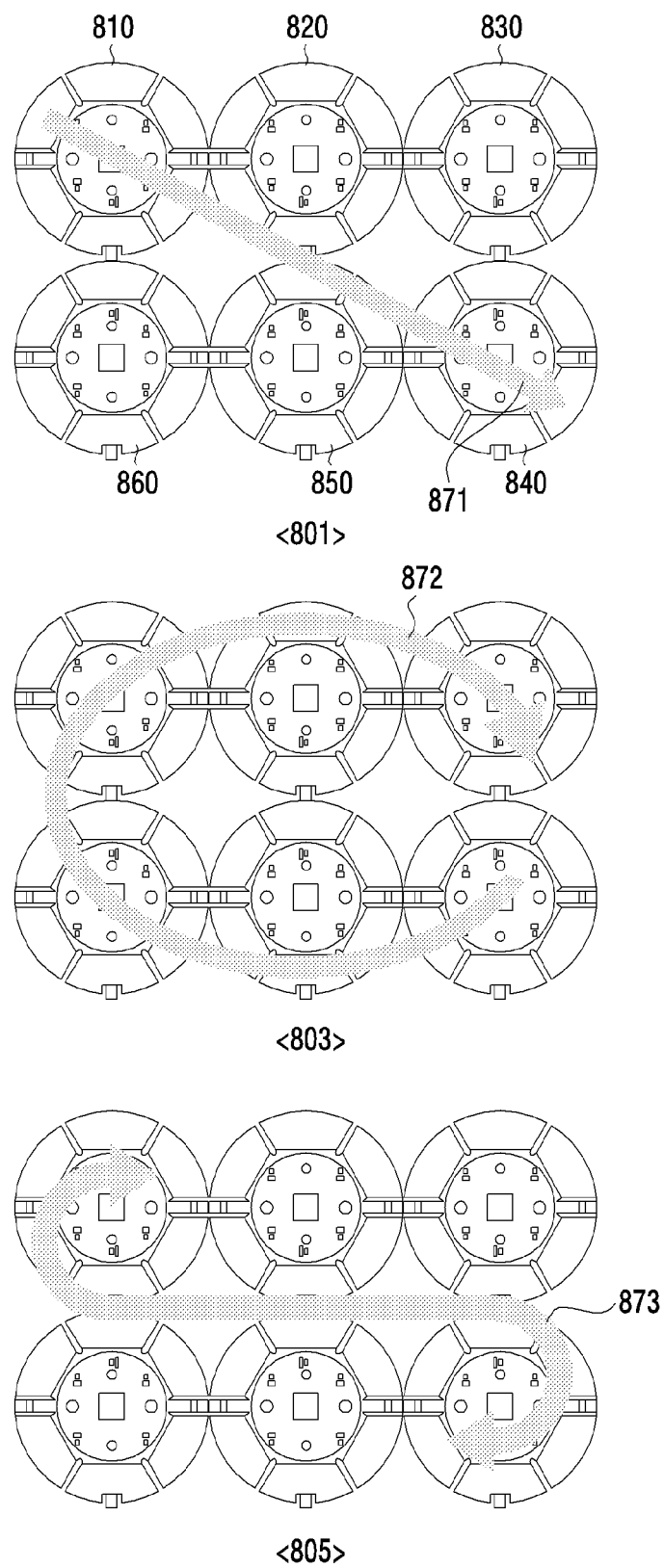
FIG. 8 illustrates a view for describing touch input sensing using a plurality of sensing units included in a sensor module according to an embodiment.

FIG. 8 illustrates a view for describing touch input sensing using a plurality of sensing units included in a sensor module according to an embodiment.

Referring to FIG. 8, a sensor module may include a plurality of sensing units. For example, the sensor module may include a first sensing unit 810, a second sensing unit 820, a third sensing unit 830, a fourth sensing unit 840, a fifth sensing unit 850, and a sixth sensing unit 860. However, the number of sensing units is not limited thereto.

The method of sensing a touch input through a plurality of sensing units described with reference to FIG. 8 may also be similar to the method of sensing a touch input using a single sensing unit as described with reference to FIG. 7. For example, assuming that the touch channels in the single sensing unit in FIG. 7 are a central portion and a plurality of peripheral portions, in FIG. 8, each of the sensing units may be a touch channel. In other words, the first sensing unit 810, the second sensing unit 820, the third sensing unit 830, the fourth sensing unit 840, the fifth sensing unit 850, and the sixth sensing unit 860 may be set as a first touch channel, a second touch channel, a third touch channel, a fourth touch channel, a fifth touch channel, and a sixth touch channel, respectively.

Accordingly, in the first state <801>, a touch input may be recognized as a touch 871 moving from the first touch channel to the fourth touch channel passing through the space between the second touch channel and the fifth touch channel, in the second state <803>, a touch input may be recognized as a touch 872 rotating in a clockwise direction from the fourth touch channel to the third touch channel via the fifth touch channel, the sixth touch channel, the first touch channel, and the second touch channel, and, in the third state <805>, a touch input may be recognized as a continuous touch 873 with a plurality of direction changes moving from the first touch channel to the fourth touch channel via the space between the first touch channel and the sixth touch channel, the space between the second touch channel and the fifth touch channel, and the space between the third touch channel and the fourth touch channel.

As described above, according to various embodiments, an electronic device (e.g., the electronic device 101 or the electronic device 200) may include: a housing (e.g., the housing 210); a sensor module disposed on an inner face of the housing and including a plurality of sensing units (e.g., the first sensing unit 230, the second sensing unit 240, the third sensing unit 250, or the fourth sensing unit 260); and a processor (e.g., the processor 120) positioned within the housing and electrically connected to the sensor module. Each of the plurality of sensing units may be electrically connected to another sensing unit adjacent thereto among the plurality of sensing units, and may include a central portion (e.g., the central portion 231, 251, or 261) and a plurality of peripheral portions (e.g., the first peripheral portion 232, 252, or 262, the second peripheral portion 233, 253, or 263, the third peripheral portion 234, 254, or 264, the fourth peripheral portion 235, 255, or 265, the fifth peripheral portion 236, 256, or 266, the sixth peripheral portion 237, 257, or 267, or the seventh peripheral portion 258 or 268) connected to a partial area of the central portion and arranged around the central portion, and each of the central portion and the plurality of peripheral portions includes a touch sensor.

According to various embodiments, the housing may include a first face (e.g., the first face 211) and a second face (e.g., the second face 213) surrounding a periphery of the first face and extending from the periphery of the first face to a point spaced apart from the first face by a predetermined distance, a partial area of the second face may include a curved face, and at least one of the central portion or the plurality of peripheral portions includes a flexible printed circuit board, which forms a seating face of the touch sensor and is bent along the shape of the inner face of the housing on which the seating face is to be disposed.

According to various embodiments, the central portion and the plurality of peripheral portions may be disposed such that a distance from an inner face of the housing thereto is within a predetermined range.

According to various embodiments, the processor may be configured to: sense a touch input through touch sensors included in at least two of the central portion and the plurality of peripheral portions; confirm mounting positions and a sensing order of touch sensors in which the touch input is sensed; and determine a touch trajectory of the touch input based on the mounting positions and the sensing order.

According to various embodiments, the processor may be configured to: set at least one vector, of which a start point is a mounting position of a first touch sensor, of which the sensing order is a preceding order among the touch sensors in which the touch input is sensed and an end point is a mounting position of a second touch sensor, of which the sensing order is a subsequent order among the touch sensors in which the touch input is sensed; and determine the touch trajectory based on the direction of the at least one vector.

According to various embodiments, the processor may be configured to: sense a touch input through at least two sensing units among the plurality of sensing units; confirm mounting positions and a sensing order of sensing units in which the touch input is sensed; and determine a touch trajectory of the touch input based on the mounting positions and the sensing order.

According to various embodiments, the processor may be configured to: set at least one vector, of which a start point is a mounting position of a first sensing unit, of which the sensing order is a preceding order among the sensing units in which the touch input is sensed and an end point is a mounting position of a second touch sensing unit, of which the sensing order is a subsequent order among the sensing units in which the touch input is sensed; and determine the touch trajectory based on the direction of the at least one vector.

According to various embodiments, the processor may be configured to: sense a touch input through at least two sensing units among the plurality of sensing units; confirm touch sensitivities of the touch sensors included in the sensing units in which the touch input is sensed and an intensity of the touch input sensed in each of the touch sensors; determine a touch position of the touch input based on the touch sensitivities of the touch sensors and the intensity of the touch input; and adjust, when it is determined that the touch position is an area between the sensing units in which the touch input is sensed, the touch sensitivities of the touch sensors adjacent to the area.

According to various embodiments, at least one of the plurality of sensing units may include a microphone (e.g., the microphone 411, 412, 413, 414, 415, 510, or 610), and the processor may be configured to: sense a touch input through a first touch sensor among a plurality of touch sensors included in the plurality of sensing units; receive a sound input through the microphone; determine the direction of the touch input based on a result of analysis of the sound input; and adjust a touch sensitivity of a second touch sensor among the plurality of touch sensors based on the direction of the touch input.

According to various embodiments, at least one of the plurality of sensing units may include an illuminance sensor (e.g., the illuminance sensor 530 or 630), and the processor may be configured to: sense a touch input through a first touch sensor among a plurality of touch sensors included in the plurality of sensing units; obtain an illuminance value through the illuminance sensor; determine a direction of the touch input based on a result of analysis of the illuminance value; and adjust a touch sensitivity of a second touch sensor among the plurality of touch sensors based on the direction of the touch input.

According to various embodiments, at least one of the plurality of sensing units may include a hall sensor (e.g., the hall sensor 650), and the processor may be configured to: determine whether an external magnetic body is attached to the housing through the hall sensor; and adjust an intensity of a motion of the electronic device based on a determination that the external magnetic body is attached to the housing.

Figure 9:
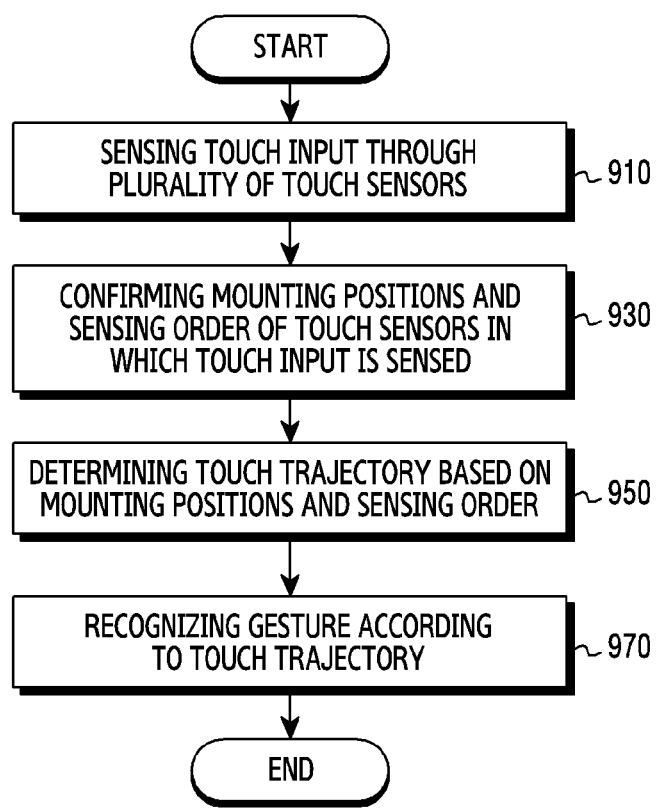
FIG. 9 illustrates a view for explaining a touch input processing method according to an embodiment.

FIG. 9 illustrates a view for explaining a touch input processing method according to an embodiment.

Referring to FIG. 9, an electronic device (e.g., the electronic device 101 or the electronic device 200) may sense a touch input through a plurality of touch sensors in operation 910. The touch sensors may be included in a plurality of sensing units included in a sensor module of the electronic device, and each of the sensing units may include a plurality of touch sensors. For example, each sensing unit may include a central portion and a plurality of peripheral portions connected to a partial area of the central portion and arranged around the central portion, in which the central portion and the peripheral portions may include the touch sensors, respectively.

When the touch input is sensed, in operation 930, the electronic device may confirm the mounting positions and sensing order of touch sensors in which the touch input is sensed. For example, depending on the sensing order, the electronic device may confirm the positions of the sensing units in which touch sensors, in which the touch input is sensed, are mounted, and/or the positions of the touch sensors in the sensing units. The positions of the sensing units may indicate the positions where the touch sensors are disposed on the inner face of the housing. The positions of the touch sensors in the sensing units indicate whether the touch sensors are disposed in the central portion of the sensing units or the touch sensors are disposed in the peripheral portion, of the sensing units, connected to the central portion in a certain direction.

In operation 950, the electronic device may determine a touch trajectory based on the mounting positions and the sensing order of the touch sensors. For example, the electronic device may set vectors of a touch input based on the mounting positions and the sensing order of the touch sensors, and may determine a touch trajectory by connecting the vectors. Any of the vectors may be, for example, a vector of which the start point is the position of the touch sensor at which the touch is sensed at the first order and the end point of the position of the touch sensor at which the touch is sensed at the second order, which is the order subsequent to the first order.

When the touch trajectory is determined, in operation 970, the electronic device may recognize the user's gesture according to the touch trajectory. For example, the electronic device may determine whether the user simply touches or strokes the electronic device, and may determine a stroking direction, a change of direction, or the like. Accordingly, the electronic device may perform an operation according to the recognized user gesture.

Figure 10:
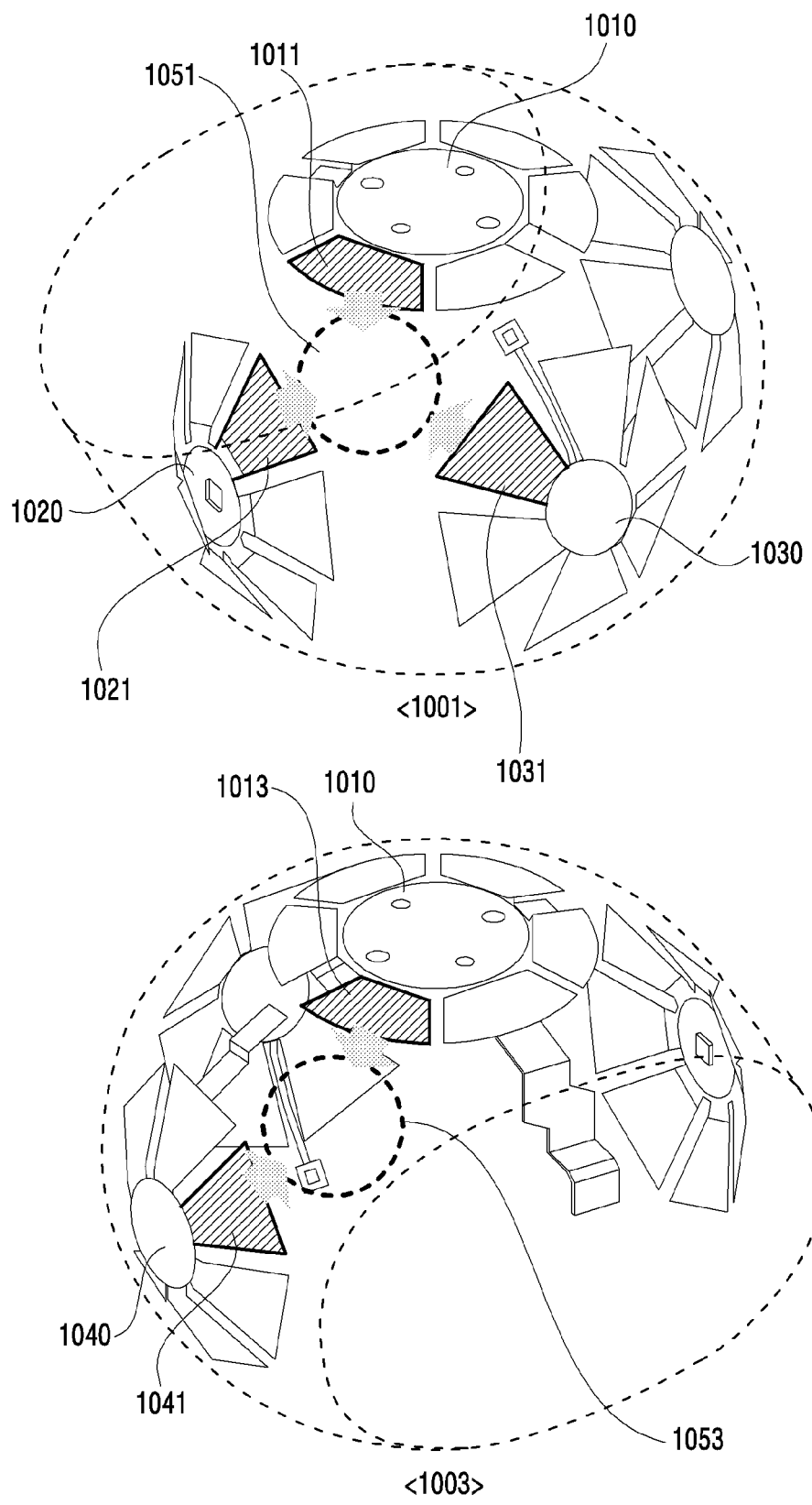
FIG. 10 illustrates a view for describing touch input sensing in an area in which a touch sensor according to an embodiment is not mounted.

FIG. 10 illustrates a view for describing touch input sensing in an area in which a touch sensor according to an embodiment is not mounted.

Referring to FIG. 10, an electronic device (e.g., the electronic device 101 or the electronic device 200) may sense a touch input in an area in which a touch sensor is not mounted (an unmounted area). In the electronic device, the unmounted area may exist between the sensing units including the touch sensors. For example, an area in which the touch sensors are not mounted may exist among three sensing areas, as in the first state <1001>, or between two sensing areas, as in the second state <1003>.

As in the first state <1001>, when a first sensing unit 1010 is disposed on the top end of the electronic device, a second sensing unit 1020 is disposed on the left side of the electronic device, and a third sensing unit 1030 is disposed on the rear side of the electronic device, a first area 1051 in which no sensing unit is mounted may exist among the first sensing unit 1010, the second sensing unit 1020, and the third sensing unit 1030. In this case, in order to recognize a touch in the first area 1051, the electronic device may increase the sensitivities of a peripheral portion 1011 of the first sensing unit 1010, a peripheral portion 1012 of the second sensing unit 1020, and a peripheral portion 1031 of the third sensing unit 1030, which are adjacent to the first area 1051. Thereafter, when a touch input occurs in the first area 1051, the electronic device may sense the touch input in the first area 1051 using sensing values (e.g., capacitance values) measured in the peripheral portion 1011 of the first sensing unit 1010, the peripheral portion 1021 of the second sensing unit 1020, and the peripheral portion 1031 of the third sensing unit 1030.

As another example, as in the second state <1003>, when the first sensing unit 1010 is disposed on the top end of the electronic device and a fourth sensing unit 1040 is disposed on the right side of the electronic device, a second area 1053 in which no sensing unit is mounted may exist between the first sensing unit 1010 and the fourth sensing unit 1040. In this case, in order to recognize a touch in the second area 1053, the electronic device may increase the sensitivities of a peripheral portion 1013 of the first sensing unit 1010 and a peripheral portion 1041 of the fourth sensing unit 1040, which are adjacent to the second area 1053. Thereafter, when a touch input occurs in the second area 1053, the electronic device may sense the touch input in the second area 1053 using sensing values (e.g., capacitance values) measured in the peripheral portion 1013 of the first sensing unit 1010 and the peripheral portion 1041 of the fourth sensing unit 1040.

Figure 11:
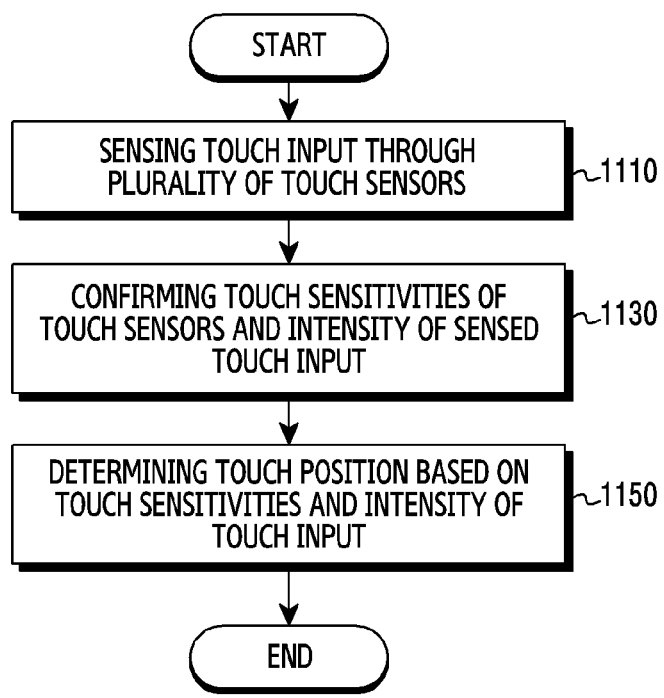
FIG. 11 illustrates a view for describing a touch input processing method in an area in which a touch sensor according to an embodiment is not mounted.

FIG. 11 illustrates a view for describing a touch input processing method in an area in which a touch sensor according to an embodiment is not mounted.

Referring to FIG. 11, in operation 1110, an electronic device (e.g., the electronic device 101 or the electronic device 200) may sense a touch input through a plurality of touch sensors. The touch sensors may be included in a plurality of sensing units included in a sensor module of the electronic device, and each of the sensing units may include a plurality of touch sensors. For example, each sensing unit may include a central portion and a plurality of peripheral portions connected to a partial area of the central portion and arranged around the central portion, in which the central portion and the peripheral portions may include the touch sensors, respectively.

When the touch input is sensed, in operation 1130, the electronic device may confirm the touch sensitivities of the touch sensors and the intensity of the touch input sensed by each of the touch sensors. In addition, in operation 1150, the electronic device may determine a touch position based on the touch sensitivities and the intensity of the touch input. For example, when the intensity of a touch input is equal to or greater than a threshold determined according to the touch sensitivities, the electronic device may determine that the touch input is made in an area where a touch sensor is mounted. As another example, when the intensity of a touch input is less than the threshold, the electronic device may determine that no touch input is made or may determine that the touch input is made in an area where no touch sensor is mounted (unmounted area). For example, when the intensity of a touch input is less than the threshold but is greater than or equal to a predetermined value, the electronic device may determine that the touch is input in the unmounted area. When the intensity of the touch input is less than the predetermined value, it may be determined that no touch input is made. In addition, the electronic device may more accurately determine a touch position in the unmounted area using a plurality of touch sensors adjacent to the unmounted area.

According to an embodiment, in order to more accurately sense a touch in the unmounted area, the electronic device may increase the sensitivities of the touch sensors adjacent to the unmounted area so that the intensity of the touch input in the unmounted area is increased to be higher than or equal to a predetermined level.

Figure 12:
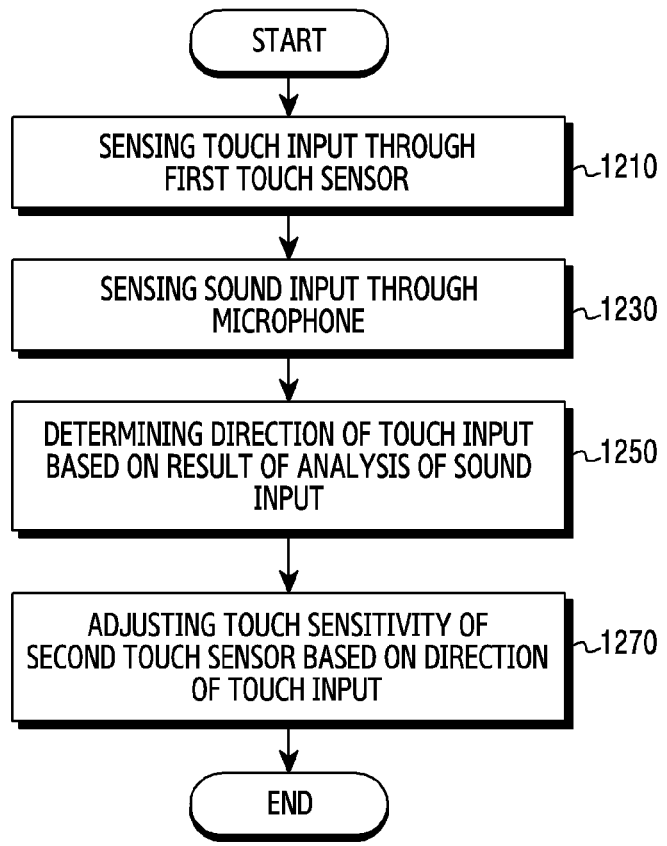
FIG. 12 illustrates a view for describing a touch input processing method for improving touch recognition using a microphone according to an embodiment.

FIG. 12 illustrates a view for describing a touch input processing method for improving touch recognition using a microphone according to an embodiment.

Referring to FIG. 12, in operation 1210, an electronic device (e.g., the electronic device 101 or the electronic device 200) may sense a touch input through a first touch sensor. The first touch sensor and a second touch sensor to be described below may be included in a plurality of sensing units included in a sensor module of the electronic device, and each of the sensing units may include a plurality of touch sensors. For example, each sensing unit may include a central portion and a plurality of peripheral portions connected to a partial area of the central portion and arranged around the central portion, in which the central portion and the peripheral portions may include the first touch sensor or the second touch sensor.

In operation 1230, the electronic device may sense a sound input through a microphone. For example, the electronic device may receive sound generated due to the touch input through the microphone. Thereafter, the electronic device may analyze the sound input. For example, the electronic device may detect a DoA of the sound.

In operation 1250, the electronic device may determine the direction of the touch input based on the result of analysis of the sound input. For example, the electronic device may determine the direction of the touch input using the DoA of the sound. In addition, the electronic device may estimate (or determine) the direction in which the user intends to perform a touch based on the direction of the touch input.

In operation 1270, the electronic device may adjust the touch sensitivity of the second touch sensor based on the direction of the touch input. The second touch sensor may be a touch sensor located in the direction in which the user intends to perform a touch based on the direction of the touch input. When the sensitivity of the second touch sensor located in the direction in which the user intends to perform a touch is increased, the touch recognition rate may be improved.

Figure 13:
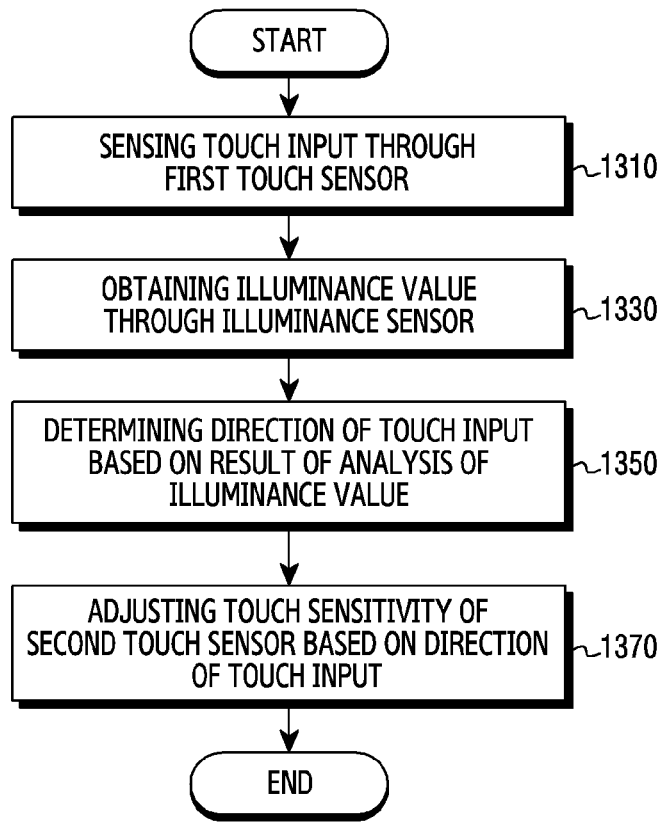
FIG. 13 illustrates a view for describing a touch input processing method for improving touch recognition using an illuminance sensor according to an embodiment.

FIG. 13 illustrates a view for describing a touch input processing method for improving touch recognition using an illuminance sensor according to an embodiment.

Referring to FIG. 13, in operation 1310, an electronic device (e.g., the electronic device 101 or the electronic device 200) may sense a touch input through a first touch sensor. The first touch sensor and a second touch sensor to be described below may be included in a plurality of sensing units included in a sensor module of the electronic device, and each of the sensing units may include a plurality of touch sensors. For example, each sensing unit may include a central portion and a plurality of peripheral portions connected to a partial area of the central portion and arranged around the central portion, in which the central portion and the peripheral portions may include the first touch sensor or the second touch sensor.

In operation 1330, the electronic device may sense an illuminance value through an illuminance sensor. For example, the electronic device may obtain a changed illuminance value according to the touch input. In addition, the electronic device may analyze the obtained illuminance value. For example, the electronic device may detect an amount of change in the illuminance value. In this case, the electronic device may use a predetermined reference illuminance value from the illuminance sensor or a plurality of illuminance values obtained at different times.

In operation 1350, the electronic device may determine the direction of the touch input based on the result of analysis of the illuminance value. For example, when the user moves a hand toward the first touch sensor to perform a touch or moves the hand away from the first touch sensor toward the second touch sensor, the illuminance value obtained through the illuminance sensor disposed at a position adjacent to the first touch sensor or the second touch sensor is changed, and, based thereon, it is possible to estimate (or determine) the direction in which the user intends to perform a touch.

In operation 1370, the electronic device may adjust the touch sensitivity of the second touch sensor based on the direction of the touch input. The second touch sensor may be a touch sensor located in the direction in which the user intends to perform a touch based on the direction of the touch input. When the sensitivity of the second touch sensor in the direction in which the user intends to perform a touch is increased, the touch recognition rate may be improved.

According to various embodiments, optical sensors other than the illuminance sensor may be used.

As described above, according to various embodiments, a touch-input-processing method of an electronic device (e.g., the electronic device 101 or the electronic device 200) may include: an operation of sensing a touch input through a sensor module disposed on an inner face of a housing (e.g., the housing 210) of the electronic device and including a plurality of sensing units (e.g., the first sensing unit 230, the second sensing unit 240, the third sensing unit 250, or the fourth sensing unit 260), each of the plurality of sensing units including a plurality of touch sensors; an operation of confirming mounting positions and a sensing order of touch sensors in which the touch input is sensed, among the plurality of touch sensors, through a processor (e.g., the processor 120) disposed inside the housing and electrically connected to the sensor module; and an operation of determining a touch trajectory of the touch input based on the mounting positions and the sensing order through the processor. Each of the plurality of sensing units may be electrically connected to another sensing unit adjacent thereto among the plurality of sensing units, and may include a central portion (231, 251, or 261) and a plurality of peripheral portions (e.g., the first peripheral portion 232, 252, or 262, the second peripheral portion 233, 253, or 263, the third peripheral portion 234, 254, or 264, the fourth peripheral portion 235, 255, or 265, the fifth peripheral portion 236, 256, or 266, the sixth peripheral portion 237, 257, or 267, or the seventh peripheral portion 258 or 268) connected to a partial area of the central portion and arranged around the central portion. Each of the central portion and the plurality of peripheral portions may include a touch sensor.

According to various embodiments, the operation of sensing the touch input may include: an operation of sensing the touch input through touch sensors included in at least two of the central portion and the plurality of peripheral portions.

According to various embodiments, the operation of determining the touch trajectory may include: an operation of setting at least one vector, of which a start point is a mounting position of a first touch sensor, of which the sensing order is a preceding order among the touch sensors in which the touch input is sensed and an end point is a mounting position of a second touch sensor, of which the sensing order is a subsequent order among the touch sensors in which the touch input is sensed; and an operation of determining the touch trajectory based on the direction of the at least one vector.

According to various embodiments, the operation of sensing the touch input may include: an operation of sensing the touch input through at least two sensing units among the plurality of sensing units, and the operation of confirming the mounting positions and the sensing order of the touch sensors may include an operation of confirming the mounting positions and the sensing order of the sensing units in which the touch input is sensed.

According to various embodiments, the operation of determining the touch trajectory may include: an operation of setting at least one vector, of which a start point is a mounting position of a first sensing unit, of which the sensing order is a preceding order among the sensing units in which the touch input is sensed and an end point is a mounting position of a second sensing unit, of which the sensing order is a subsequent order among the sensing units in which the touch input is sensed; and an operation of determining the touch trajectory based on a direction of the at least one vector.

According to various embodiments, the operation of sensing the touch input may include: an operation of sensing the touch input through at least two sensing units among the plurality of sensing units. The touch input processing method may further include: an operation of confirming touch sensitivities of the touch sensors included in the sensing units in which the touch input is sensed, and an intensity of the touch input sensed in each of the touch sensors; an operation of determining a touch position of the touch input based on the touch sensitivities of the touch sensors and the intensity of the touch input; and an operation of adjusting, when it is determined that the touch position is an area between the sensing units in which the touch input is sensed, the touch sensitivities of the touch sensors adjacent to the area.

According to various embodiments, the operation of sensing the touch input may include: an operation of sensing the touch input through a first touch sensor among the plurality of touch sensors included in the plurality of sensing units. The touch input processing method may further include: an operation of receiving a sound input through the microphone (e.g., the microphone 411, 412, 413, 414, 510, or 610) included in at least one of the plurality of sensing units; an operation of determining a direction of the touch input based on a result of analysis of the sound input; and an operation of adjusting a touch sensitivity of a second touch sensor among the plurality of touch sensors based on the direction of the touch input.

According to various embodiments, the operation of sensing the touch input may include an operation of sensing the touch input through a first touch sensor among the plurality of touch sensors included in the plurality of sensing units. The touch input processing method may further include: an operation of obtaining an illuminance value through an illuminance sensor (e.g., the illuminance sensor 530 or 630) included in at least one of the plurality of sensing units; an operation of determining a direction of the touch input based on a result of analysis of the illuminance value; and an operation of adjusting a touch sensitivity of a second touch sensor among the plurality of touch sensors based on the direction of the touch input.

According to various embodiments, the touch input processing method may further include: an operation of determining whether an external magnetic body is attached to the housing through a hall sensor (e.g., the hall sensor 650) included in at least one of the plurality of sensing units; and an operation of adjusting an intensity of a motion of the electronic device based on a determination that the external magnetic body is attached to the housing.

Figure 14:
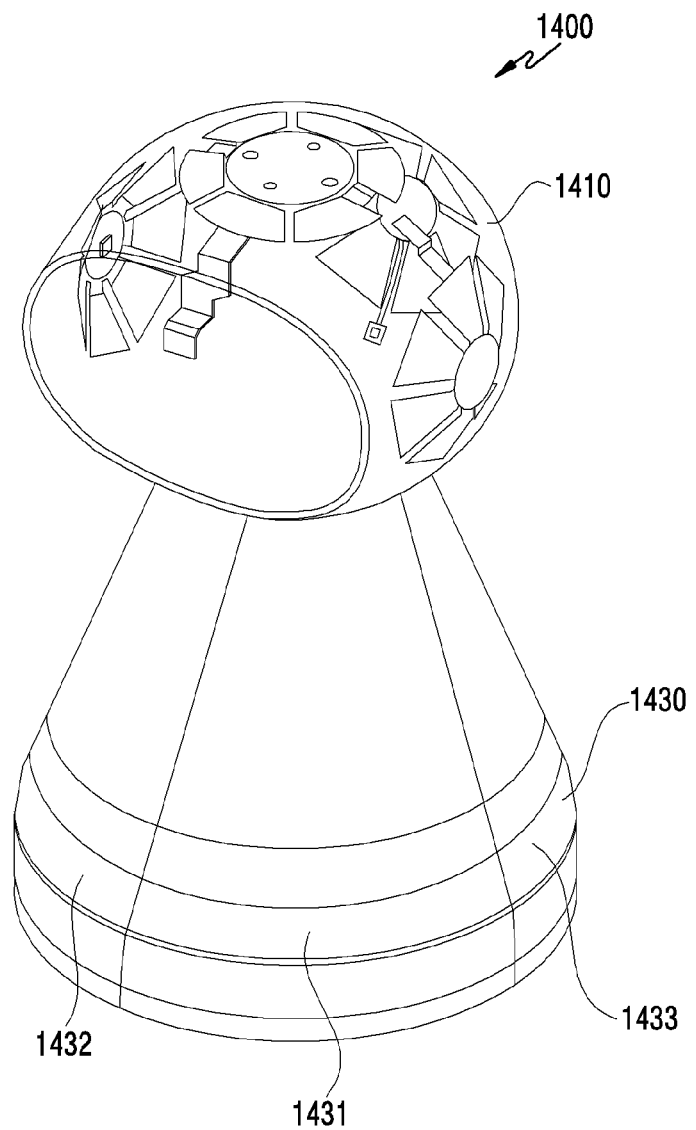
FIG. 14 is a perspective view illustrating an electronic device having a head and a body according to an embodiment.

FIG. 14 is a perspective view illustrating an electronic device having a head and a body according to an embodiment.

Referring to FIG. 14, an electronic device 1400 (e.g., the electronic device 101) may include a head 1410 and a body 1430. The shape of the head 1410 may be similar to the shape of the electronic device 200 in FIG. 2. The body 1430 may include a top face on which the head 1410 is seated and fixed, a bottom face, which is in contact with the ground such that the body 1430 is stably placed on the ground, and a side face surrounding the space between the top face and the bottom face. The side face may include a curved face in at least a partial area thereof.

The sensor module may be disposed inside the side face. The sensor module disposed in the body 1430 may have a shape, which is the same as or similar to that of the sensor module described with reference to FIGS. 3 to 6. In addition, the sensor module disposed in the body 1430 may perform a function, which is the same as or similar to that of the sensor module described with reference to FIGS. 3 to 6. For example, the sensor module may include a plurality of sensing units (e.g., a first sensing unit 1431, a second sensing unit 1432, or a third sensing unit 1433), and each sensing unit may include a touch sensor configured to receive a user's touch input. In addition, the sensing unit may further include at least one of a microphone that receives a sound input, an optical sensor, an illuminance sensor, or a hall sensor.

Figure 15:
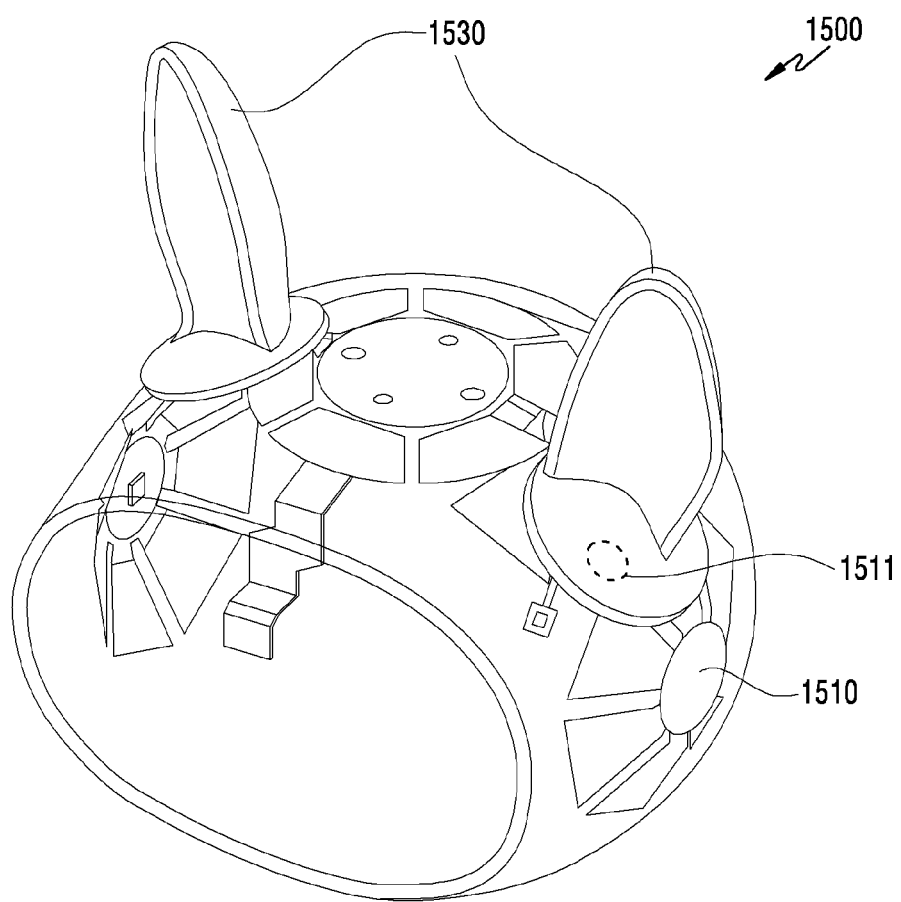
FIG. 15 illustrates a view for describing a method of executing an expansion function using a hall sensor according to an embodiment.

FIG. 15 illustrates a view for describing a method of executing an expansion function using a hall sensor according to an embodiment.

Referring to FIG. 15, an electronic device 1500 (e.g., the electronic device 101 or the electronic device 200) may further include a hall sensor 1511. The hall sensor 1511 may be included in at least one sensing unit 1510 included in the sensor module of the electronic device.

The hall sensor 1511 may sense magnetism. The electronic device may determine the approach of an external magnetic body through the hall sensor 1511. For example, the electronic device may determine whether a magnetic accessory 1530 is attached to the housing of the electronic device through the hall sensor 1511. When it is determined that the magnetic accessory 1530 is attached, the electronic device may adjust the intensity of the motion of the electronic device. For example, the electronic device may move slowly by lowering the intensity of the motion such that the magnetic accessory 1530 is not removed from the housing.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Although the present disclosure has been described with various embodiments, various changes and modifications may be suggested to one skilled in the art. It is intended that the present disclosure encompass such changes and modifications as fall within the scope of the appended claims.

What is claimed is:

1. An electronic device comprising:
a housing including a first face and a second face, wherein the second face surrounds a periphery of the first face and extends from the periphery of the first face to a point spaced apart from the first face by a predetermined distance, and a partial area of the second face includes a curved face;
a sensor module disposed on an inner face of the housing, the sensor module including a plurality of sensing units, wherein at least a portion of the sensor module is bent along a curved portion of the inner face; and
a processor positioned within the housing, the processor electrically connected to the sensor module,
wherein each of the plurality of sensing units is electrically connected to another sensing unit adjacent thereto among the plurality of sensing units,
wherein each of the plurality of sensing units includes a central portion and a plurality of peripheral portions, the plurality of peripheral portions connected to a partial area of the central portion and arranged around the central portion,
wherein each of the central portion and the plurality of peripheral portions includes a touch sensor, and
wherein at least one of the central portion or the plurality of peripheral portions includes a flexible printed circuit board, the flexible printed circuit board forming a seating face of the touch sensor and bent along a shape of the inner face of the housing on which the seating face is disposed.

2. The electronic device of claim 1, wherein the central portion and the plurality of peripheral portions are disposed such that a distance from the inner face of the housing thereto is within a predetermined range.

3. The electronic device of claim 1, wherein the processor is configured to:
sense a touch input through touch sensors included in at least two of the central portion and the plurality of peripheral portions;
confirm mounting positions and a sensing order of touch sensors in which the touch input is sensed; and
determine a touch trajectory of the touch input based on the mounting positions and the sensing order.

4. The electronic device of claim 3, wherein the processor is further configured to:
set at least one vector of which:
a start point is a mounting position of a first touch sensor, of which the sensing order is a preceding order among the touch sensors in which the touch input is sensed, and
an end point is a mounting position of a second touch sensor, of which the sensing order is a subsequent order among the touch sensors in which the touch input is sensed; and
determine the touch trajectory based on a direction of the at least one vector.

5. The electronic device of claim 1, wherein the processor is configured to:
sense a touch input through at least two sensing units among the plurality of sensing units;
confirm mounting positions and a sensing order of sensing units in which the touch input is sensed; and
determine a touch trajectory of the touch input based on the mounting positions and the sensing order.

6. The electronic device of claim 5, wherein the processor is further configured to:
set at least one vector of which:
a start point is a mounting position of a first sensing unit, of which the sensing order is a preceding order among the at least two sensing units in which the touch input is sensed, and
an end point is a mounting position of a second sensing unit, of which the sensing order is a subsequent order among the at least two sensing units in which the touch input is sensed; and
determine the touch trajectory based on a direction of the at least one vector.

7. The electronic device of claim 1, wherein the processor is configured to:
sense a touch input through at least two sensing units among the plurality of sensing units;
confirm touch sensitivities of touch sensors included in the at least two sensing units in which the touch input is sensed and an intensity of the touch input sensed in each of the touch sensors included in the at least two sensing units;
determine a touch position of the touch input based on the touch sensitivities of the touch sensors included in the at least two sensing units and the intensity of the touch input; and
adjust, upon determining that the touch position is an area between the at least two sensing units in which the touch input is sensed, touch sensitivities of one or more touch sensors adjacent to the area of the touch sensors included in the at least two sensing units.

8. The electronic device of claim 1, wherein at least one of the plurality of sensing units includes a microphone and the processor is configured to:
sense a touch input through a first touch sensor among a plurality of touch sensors included in the plurality of sensing units;
receive a sound input through the microphone;
determine a direction of the touch input based on a result of analysis of the sound input; and
adjust a touch sensitivity of a second touch sensor among the plurality of touch sensors based on the direction of the touch input.

9. The electronic device of claim 1, wherein at least one of the plurality of sensing units includes an illuminance sensor and the processor is configured to:
sense a touch input through a first touch sensor among a plurality of touch sensors included in the plurality of sensing units;
obtain an illuminance value through the illuminance sensor;
determine a direction of the touch input based on a result of analysis of the illuminance value; and
adjust a touch sensitivity of a second touch sensor among the plurality of touch sensors based on the direction of the touch input.

10. The electronic device of claim 1, wherein at least one of the plurality of sensing units includes a hall sensor and the processor is configured to:
determine whether an external magnetic body is attached to the housing through the hall sensor; and
adjust an intensity of a motion of the electronic device based on a determination that the external magnetic body is attached to the housing.

11. A touch input processing method of an electronic device, the method comprising:
sensing a touch input through a sensor module disposed on an inner face of a housing of the electronic device, the sensor module including a plurality of sensing units, each of the plurality of sensing units including a plurality of touch sensors;

confirming mounting positions and a sensing order of one or more touch sensors in which the touch input is sensed among the plurality of touch sensors through a processor, the processor disposed inside the housing and electrically connected to the sensor module; and determining a touch trajectory of the touch input based on the mounting positions and the sensing order through the processor, wherein each of the plurality of sensing units is electrically connected to another sensing unit adjacent thereto among the plurality of sensing units, wherein each of the plurality of sensing units includes a central portion and a plurality of peripheral portions, the plurality of peripheral portions connected to a partial area of the central portion and arranged around the central portion, and wherein each of the central portion and the plurality of peripheral portions includes a touch sensor.

12. The method of claim 11, wherein the sensing of the touch input includes sensing the touch input through touch sensors included in at least two of the central portion and the plurality of peripheral portions.

13. The method of claim 12, wherein the determining of the touch trajectory includes:

setting at least one vector of which:
  a start point is a mounting position of a first touch sensor, of which the sensing order is a preceding order among the one or more touch sensors in which the touch input is sensed, and
  an end point is a mounting position of a second touch sensor, of which the sensing order is a subsequent order among the one or more touch sensors in which the touch input is sensed; and
determining the touch trajectory based on a direction of the at least one vector.

14. The method of claim 11, wherein:
the sensing of the touch input includes sensing the touch input through at least two sensing units among the plurality of sensing units; and
the confirming of the mounting positions and the sensing order of the one or more touch sensors includes confirming the mounting positions and the sensing order of the at least two sensing units in which the touch input is sensed.

15. The method of claim 14, wherein the determining of the touch trajectory includes:

setting at least one vector of which:
  a start point is a mounting position of a first sensing unit, of which the sensing order is a preceding order among the at least two sensing units in which the touch input is sensed, and
  an end point is a mounting position of a second sensing unit, of which the sensing order is a subsequent order among the at least two sensing units in which the touch input is sensed; and
determining the touch trajectory based on a direction of the at least one vector.

16. The method of claim 11, wherein:
the sensing of the touch input includes sensing the touch input through at least two sensing units among the plurality of sensing units, and
the method further comprises:
  confirming touch sensitivities of touch sensors included in the at least two sensing units in which the touch input is sensed and an intensity of the touch input sensed in each of the touch sensors;
  determining a touch position of the touch input based on the touch sensitivities of the touch sensors included in the at least two sensing units and the intensity of the touch input; and
  adjusting, upon determining that the touch position is an area between the at least two sensing units in which the touch input is sensed, touch sensitivities of one or more touch sensors adjacent to the area of the touch sensors included in the at least two sensing units.

17. The method of claim 11, wherein:
the sensing of the touch input includes sensing the touch input through a first touch sensor among the plurality of touch sensors included in the plurality of sensing units, and
the method further comprises:
  receiving a sound input through a microphone included in at least one of the plurality of sensing units;
  determining a direction of the touch input based on a result of analysis of the sound input; and
  adjusting a touch sensitivity of a second touch sensor among the plurality of touch sensors based on the direction of the touch input.

18. The method of claim 11, wherein:
the sensing of the touch input includes sensing the touch input through a first touch sensor among the plurality of touch sensors included in the plurality of sensing units, and
wherein the method further comprises:
  obtaining an illuminance value through an illuminance sensor included in at least one of the plurality of sensing units;
  determining a direction of the touch input based on a result of analysis of the illuminance value; and
  adjusting a touch sensitivity of a second touch sensor among the plurality of touch sensors based on the direction of the touch input.

19. The method of claim 11, further comprising:
determining whether an external magnetic body is attached to the housing through a hall sensor included in at least one of the plurality of sensing units; and
adjusting an intensity of a motion of the electronic device based on a determination that the external magnetic body is attached to the housing.

* * * * *